(12) United States Patent
Baek et al.

(10) Patent No.: US 7,897,425 B2
(45) Date of Patent: Mar. 1, 2011

(54) IMAGE SENSOR AND METHOD FOR FABRICATING THE SAME

(75) Inventors: In Cheol Baek, Suwon-si (KR); Kyung Min Park, Incheon (KR); Sun Chan Lee, Changnyeong-gun (KR); Han Choon Lee, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 268 days.

(21) Appl. No.: 12/145,441

(22) Filed: Jun. 24, 2008

(65) Prior Publication Data

US 2008/0315271 A1 Dec. 25, 2008

(30) Foreign Application Priority Data

Jun. 25, 2007 (KR) .................... 10-2007-0062163

(51) Int. Cl.
*H01L 27/14* (2006.01)
*H01L 21/311* (2006.01)
(52) U.S. Cl. ................. 438/57; 257/461; 257/E31.067; 257/E21.165
(58) Field of Classification Search ................ 257/461, 257/E21.165, E31.067; 438/57
See application file for complete search history.

(56) References Cited

U.S. PATENT DOCUMENTS

| | | | | |
|---|---|---|---|---|
| 7,071,505 B2* | 7/2006 | Rhodes | ........................ | 257/292 |
| 7,544,530 B2* | 6/2009 | Han | ........................... | 438/48 |
| 7,566,925 B2* | 7/2009 | Song et al. | ................... | 257/292 |
| 7,700,399 B2* | 4/2010 | Yang et al. | .................... | 438/98 |
| 2004/0043310 A1* | 3/2004 | Takeishi et al. | ............... | 430/22 |
| 2005/0205955 A1* | 9/2005 | Shim | .......................... | 257/432 |
| 2006/0284223 A1* | 12/2006 | Kim | ............................. | 257/292 |
| 2008/0102551 A1* | 5/2008 | Park et al. | ..................... | 438/57 |
| 2009/0004769 A1* | 1/2009 | Jeong et al. | ................... | 438/69 |
| 2009/0224298 A1* | 9/2009 | Han | ............................ | 257/292 |

FOREIGN PATENT DOCUMENTS

JP 2007-027311 2/2007
JP 2008177306 A * 7/2008

* cited by examiner

*Primary Examiner*—Allan R Wilson
(74) *Attorney, Agent, or Firm*—Workman Nydegger

(57) ABSTRACT

A method for fabricating an image sensor. The method may include forming a gate, a photo diode, and a floating diffusion region on a pixel region of a semiconductor substrate; forming an oxide film on the pixel region and on an edge region of the semiconductor substrate; forming a sacrificial oxide layer by etching the oxide film using a first photoresist pattern as a mask; forming a metal layer on the first photoresist pattern, the gate, and the floating diffusion region; forming a salicide layer on the gate and the floating diffusion region; etching a remaining non-salicided portion of the metal layer, the first photoresist pattern, and the sacrificial oxide layer; forming an interlayer insulating film on the semiconductor substrate and planarizing the interlayer insulating film; and forming contact holes and forming an edge open part by etching the interlayer insulating film using a second photoresist pattern as a mask.

13 Claims, 4 Drawing Sheets

IMAGE SENSOR AND METHOD FOR FABRICATING THE SAME

CROSS-REFERENCE TO RELATED APPLICATION

This application claims the benefit of Korean Patent Application No. 10-2007-0062163, filed Jun. 25, 2007, which is hereby incorporated by reference as if fully set forth herein.

BACKGROUND

1. Field of the Invention

The present invention relates to a semiconductor element and more particularly, to a CMOS image sensor and a method for fabricating the same.

2. Discussion of the Related Art

A CMOS image sensor is a type of image sensor having a unit pixel manufactured using a CMOS technique. Peripheral circuits in a CMOS image sensor may include a control circuit and a signal processing circuit.

A method for fabricating a CMOS image sensor may employ a salicide process to lower resistance at an active region and at a gate on a pixel region. Metal films used to carry out the salicide process typically have high reflexibility of light, and are formed on the active region except for a photo diode. Particularly, a salicide film may be formed on an edge region of a semiconductor substrate in addition to the pixel region.

The salicide film formed on the edge region of the semiconductor substrate has a low adhesive strength with an insulating film, and thus may cause generation of insulating film particles, such as circle defects, in a subsequent planarization process of the insulating film. If the particles fall down on contact holes a defect, such as a void, may result when contact plugs are subsequently formed.

SUMMARY OF SOME EXAMPLE EMBODIMENTS

In general, example embodiments of the invention relate to an image sensor and a method for fabricating the same.

Example embodiments provide a number of advantages, including the ability to improve an adhesive strength between a semiconductor substrate and an insulating film.

According to one example embodiment, a method for fabricating an image sensor may include forming a gate on a pixel region of a semiconductor substrate; forming a photo diode on the pixel region at a first side of the gate, and forming a floating diffusion region on the pixel region at a second side of the gate; forming an oxide film on the pixel region on which the gate, the photo diode, and the floating diffusion region are formed and on an edge region of the semiconductor substrate; forming a first photoresist pattern having openings corresponding to the gate and the floating diffusion region on the oxide film, and forming a sacrificial oxide layer by etching the oxide film using the first photoresist pattern as a mask; forming a metal layer on the first photoresist pattern, the gate, and the floating diffusion region; forming a salicide layer on the gate and the floating diffusion region by performing rapid thermal processing; etching a remaining non-salicided portion of the metal layer, the first photoresist pattern, and at least a portion of the sacrificial oxide layer; forming an interlayer insulating film on the semiconductor substrate and planarizing the interlayer insulating film forming a second photoresist pattern having first, second, and third openings on the interlayer insulating film; and forming contact holes respectively corresponding to the gate and the floating diffusion region and forming an edge open part exposing a portion of the semiconductor substrate in the edge region by etching the interlayer insulating film on the edge region using the second photoresist pattern as an etching mask.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter. Moreover, it is to be understood that both the foregoing general description and the following detailed description are exemplary and explanatory.

Additional features will be set forth in the description which follows, and in part will be obvious from the description, or may be learned by the practice of the teachings herein. Features of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

The accompanying drawings, which are included to provide a further understanding of example embodiments of the invention and are incorporated in and constitute a part of this application, illustrate the example embodiments and together with the description serve to explain particular features of the example embodiments. In the drawings.

DETAILED DESCRIPTION OF SOME EXAMPLE EMBODIMENTS

Figure 1:
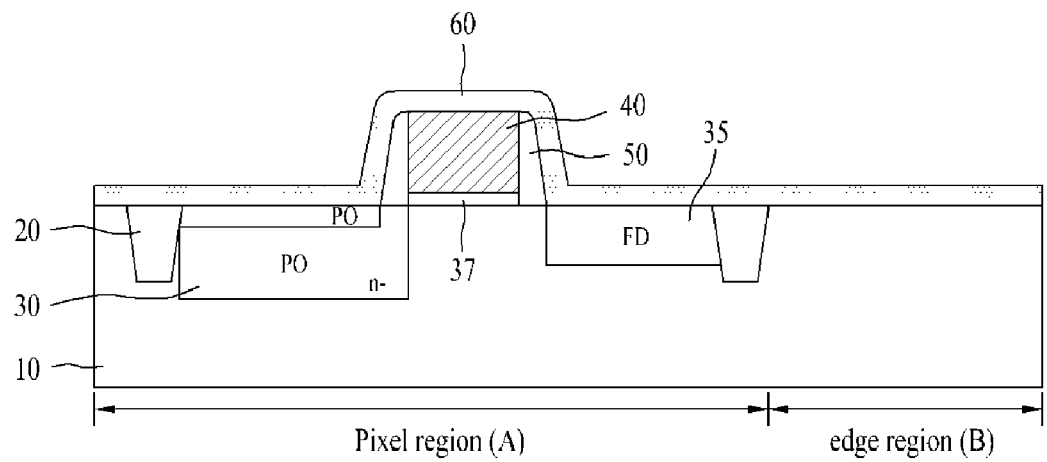
FIGS. 1 to 8 are cross-sectional views illustrating stages of a process for fabricating an image sensor in accordance with an exemplary embodiment of the present invention.

In the following detailed description of the embodiments, reference will now be made in detail to specific embodiments of the present invention, examples of which are illustrated in the accompanying drawings. These embodiments are described in sufficient detail to enable those skilled in the art to practice the invention. Other embodiments may be utilized and structural, logical and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

It will be understood that when an element such as a layer, region or substrate is referred to as being "on/over" another element, it can be directly on the other element or intervening elements may also be present.

Moreover, in the drawings the thicknesses or sizes of respective layers are magnified, omitted, or schematically illustrated for the convenience or clearness of illustration. The depicted sizes of respective elements do not represent the real sizes of the elements.

Figure 8:
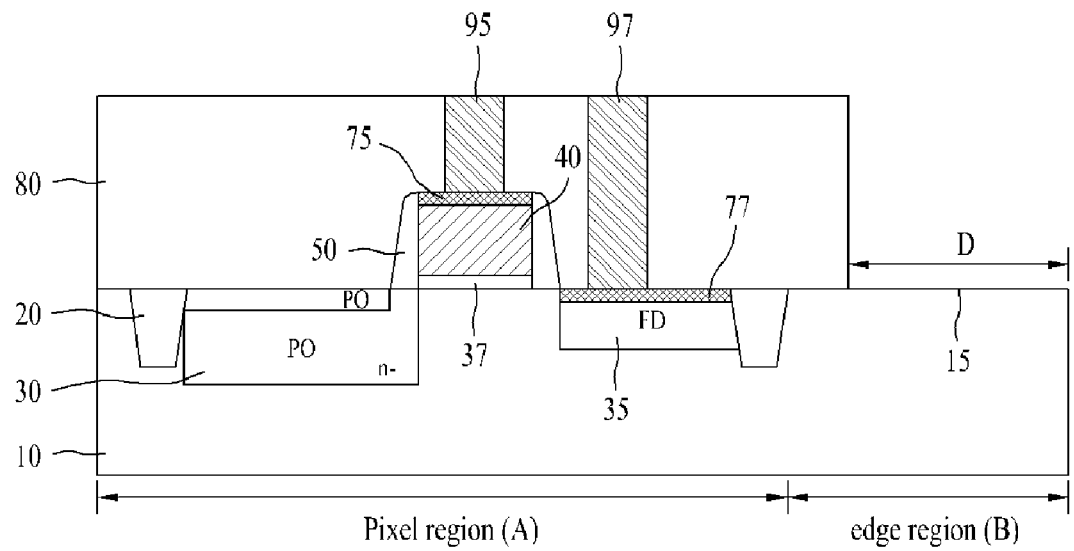

FIG. 8 is a cross-sectional view illustrating an image sensor in accordance with an example embodiment of the present invention.

With reference to FIG. 8, unit pixels, each of which includes a photo diode 30, may be disposed on a semiconductor substrate 10. A portion of the semiconductor substrate 10, in which an element, such as the unit pixel, is formed, is referred to as a pixel region (A), and another portion of the semiconductor substrate 10, in which laser marks for classifying a semiconductor element may be formed, is referred to as an edge region (B). The pixel region (A) and the edge region (B) may be isolated from each other by an element isolation film 20.

The photo diode 30 and a gate 40 of a transistor forming part of the unit pixel may be disposed on the pixel region (A). Although not shown in FIG. 8, the transistor forming part of the unit pixel may be a transfer transistor, a reset transistor, a drive transistor, or a select transistor.

In one embodiment the gate 40 may be a gate of a transfer transistor being adjacent to the photo diode 30. The photo diode 30 may be disposed at one side of the gate 40, and a floating diffusion region 35 may be disposed at another side of the gate 40. Salicide layers 75 and 77 may be respectively disposed on the gate 40 and the floating diffusion region 35, and may serve to lower a contact resistance for subsequently formed contacts. The salicide layers 75 and 77 may be made of, for example, at least one of cobalt, nickel, and titanium.

An interlayer insulating film 80 for insulating wiring elements from each other may be disposed on the pixel region (A) including the unit pixel and the edge region (B). Contact plugs 95 and 97 may be disposed in the interlayer insulating film 80 on the pixel region (A), and may be electrically connected to the gate 40 and the floating diffusion region 35, respectively.

A portion of the interlayer insulating film 80 on the edge region (B) may be selectively removed, thus forming an edge open part 15 and thereby exposing an edge of the edge region (B). The edge open part 15 may have a width of, for example, about 1.0 to 2.0 mm, and may expose chip classifying laser marks to be formed on the edge region (B).

Hereinafter, with reference to FIGS. 1 to 8, a method for fabricating an image sensor in accordance with an exemplary embodiment of the present invention will be described.

As shown in FIG. 1, a portion of a semiconductor substrate 10, in which an element, such as the unit pixel, is formed, is referred to as a pixel region (A), and the edge portion of the semiconductor substrate 10, in which the unit pixel is not formed, is referred to as an edge region (B).

An element isolation film 20 for defining an active region and a field region of a unit pixel and for isolating unit pixels from each other may be formed on the pixel region (A).

Laser marks for classifying a semiconductor element according to a chip identification may be formed on the edge region (B). A photo diode 30 and a gate of a transistor circuit forming part of the unit pixel may be formed on the pixel region (A).

The gate may include a gate insulating film 37, a gate electrode 40, and a gate spacer 50. The gate insulating film 37 and the gate electrode 40 may be formed, for example, by forming a gate oxide film and a polysilicon film on the pixel region (A) and patterning the gate oxide film and the polysilicon film through a photolithography process and an etching process. The gate spacer 50 may be formed on side walls of the gate insulating film 37 and the gate electrode 40 by depositing an insulating film on the pixel region (A), including the gate insulating film 37 and the gate electrode 40 formed thereon, and then performing an etch-back process. The gate may be a gate of a transfer transistor formed adjacent to the photo diode 30.

The photo diode 30 may be disposed at a first side of the gate, and a floating diffusion region 35 may be disposed at a second side of the gate, opposite the first side.

The photo diode 30 may include an n-type region at one side of the gate, and a p-type region having a small depth in the n-type region.

The floating diffusion region 35 may be arranged at the spacer 50 at the other side of the gate by using the gate electrode 40 and the spacer 50 as an ion implantation mask, after the spacer 50 contacting both side walls of the gate is formed.

An oxide film 60 may be formed on the semiconductor substrate 10 including the pixel region (A) and the edge region (B). The oxide film 60 may be formed, for example, by a thermal oxidation method.

Figure 2:
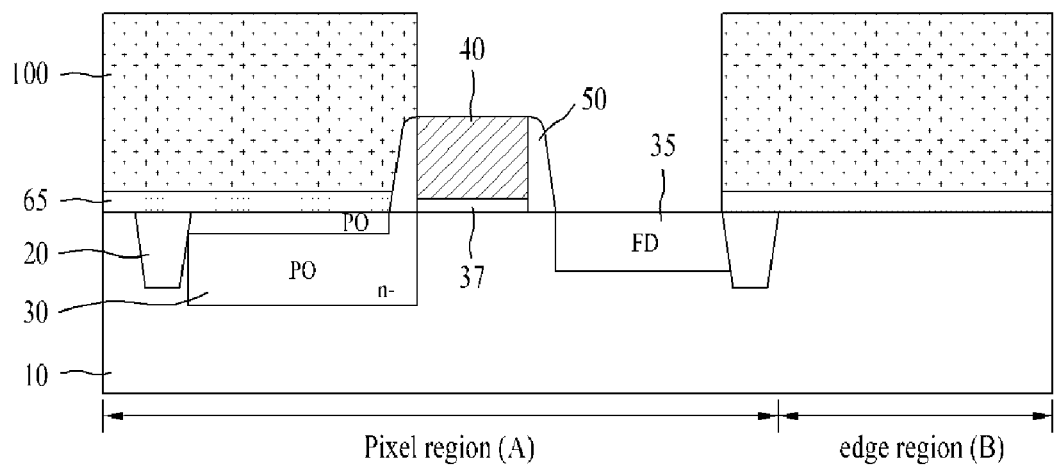

As shown in FIG. 2, a sacrificial oxide layer 65 and a first photoresist pattern 100 may be formed on the photo diode 30 of the pixel region (A) and on the edge region (B) by etching the oxide layer 60.

The sacrificial oxide layer 65 may be formed by first forming the first photoresist pattern 100 on the oxide film 60 to expose portion of the oxide film 60. For example, the first photoresist pattern 100 may expose the upper portion of the gate, the spacer 50 at the second side of the gate, and the floating diffusion region 35, without exposing other portions.

Thereafter, the oxide film 60 may be etched using the first photoresist pattern 100 as an etching mask. Accordingly, the sacrificial oxide layer 65 may be formed on the photo diode 30 of the pixel region (A) and on the edge region (B), exposing the gate of the pixel region (A) and exposing the floating diffusion region 35. As a result, the photo diode 30 and the edge region (B) may be non-salicided by the sacrificial oxide layer 65 in a subsequently performed salicide process.

Figure 3:
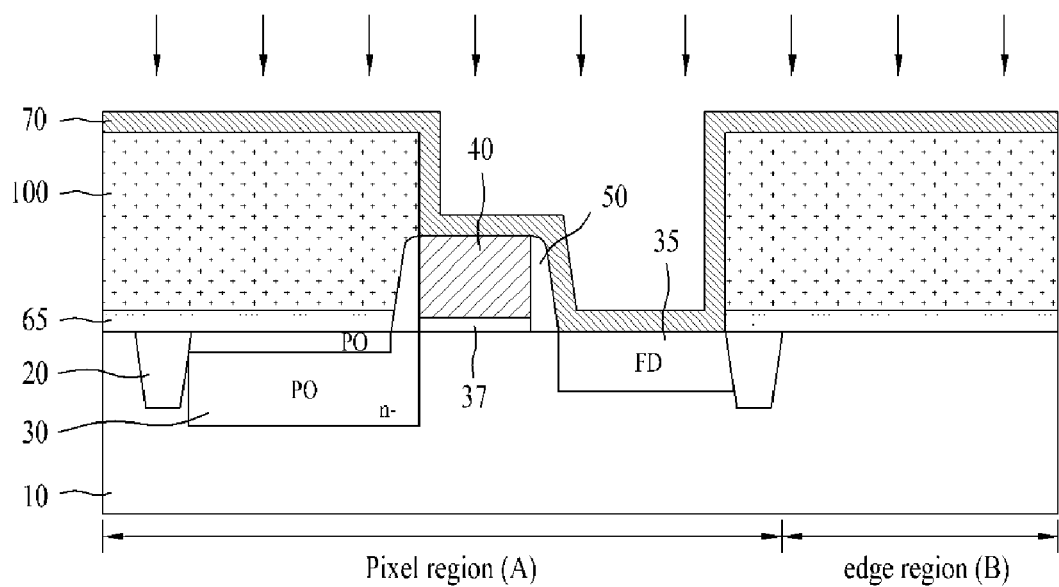

As shown in FIG. 3, a metal layer 70 may be formed on the semiconductor substrate 10, on which the sacrificial oxide layer 65 and the first photoresist pattern 100 are formed. The metal layer 70 may be formed by depositing a metal having conductivity, such as cobalt, nickel, or titanium. In one embodiment the metal layer 70 may be formed by, for example, depositing cobalt using a physical vapor deposition (PVD) method.

The metal layer 70 may be formed on the pixel region (A) and the edge region (B), where the first photoresist pattern 100 is formed, and on the gate and the floating diffusion region 35, which are exposed by the sacrificial oxide layer 65.

A salicide layer may be formed by performing rapid thermal processing (hereinafter, referred to as 'RTP') on the metal layer 70. The RTP may be carried out, for example, at a temperature of about 300 to 1,000° C.

During the RTP, the gate electrode 40 and the floating diffusion region 35 react with the metal layer 70 and thus are salicided. The photo diode 30 and the edge region (B), on the other hand, are non-salicided because the sacrificial oxide layer 65 and the first photoresist pattern 100 prevent a reaction with the metal layer 70 from occurring in those regions.

Figure 4:
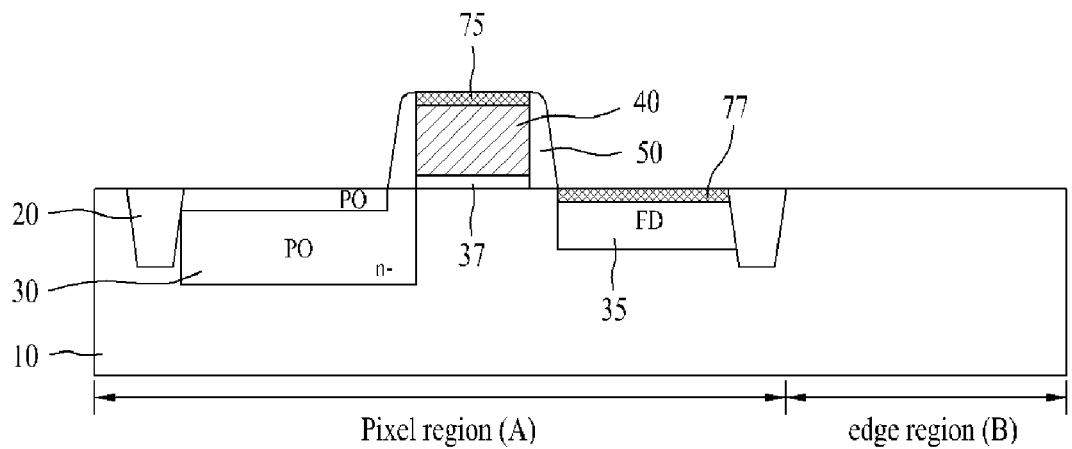

Thereafter, as shown in FIG. 4, non-salicided portions of metal layer 70 formed on the photo diode 30 and the edge region (B) may be removed together with the first photoresist pattern 100 and at least a portion of the sacrificial oxide layer 65. Salicide layers 75 and 77 are thus respectively formed on the gate electrode 40 and the floating diffusion region 35 and the surfaces of the photo diode 30 and the edge region (B) are exposed to the outside. Although the sacrificial oxide layer 65 is depicted as being completely removed, a portion may remain on the photo diode 30 of the pixel region (A) and on the edge region (B).

Since the photo diode 30 is non-salicided by virtue of the sacrificial oxide layer 65 and the first photoresist pattern 100 covering the photo diode 30 during the RTP, light sensitivity of the image sensor may be improved relative to a salicided photo diode.

Further, since the edge region (B) is non-salicided, an adhesive strength of the edge region (B) with an interlayer insulating film 80 to be formed on the edge region (B) may be improved. Moreover, improved adhesive strength of the edge region (B) with the interlayer insulating film 80 may be attributed at least in part to the presence of the remaining sacrificial oxide layer 65.

Figure 5:
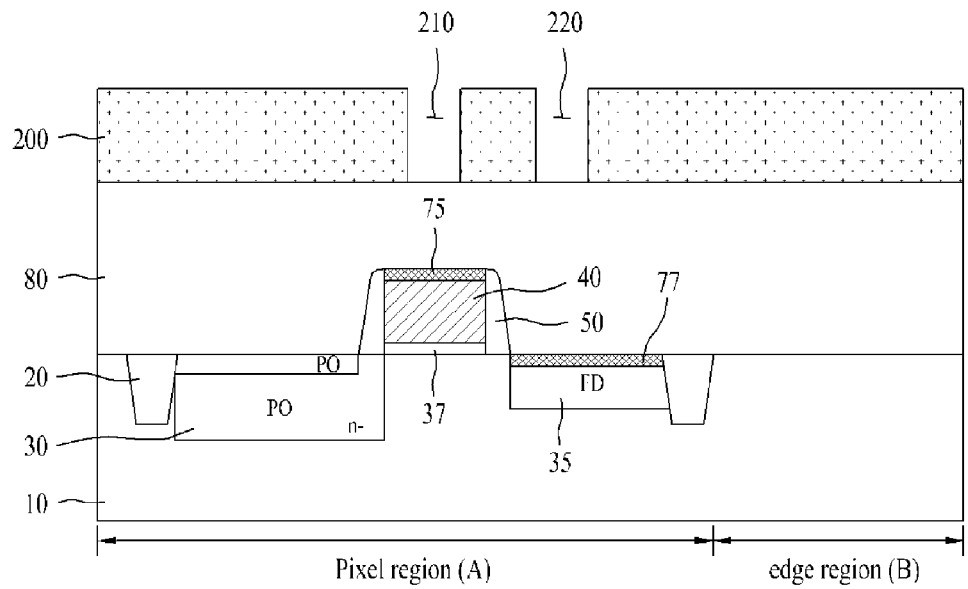

As shown in FIG. 5, the interlayer insulating film 80 may be formed on the pixel region (A) and the edge region (B), and a second photoresist pattern 200 may be formed on the interlayer insulating film 80 by a photolithography process.

The interlayer insulating film 80 may be formed on the semiconductor substrate 10, including the pixel region (A) and the edge region (B). The interlayer insulating film 80 may be an insulating film including, for example, at least one of borophospho silicate glass (BPSG) and undoped silicate glass (USG). After the interlayer insulating film 80 is formed, a planarization process may be performed on the interlayer insulating film 80. The planarization process may be carried out by, for example, chemical mechanical polishing (CMP).

Since the edge region (B), on which at least a portion of the interlayer insulating film 80 is formed, is non-salicided (as opposed to salicided), the adhesive strength of the interlayer insulating film 80 with the semiconductor substrate 10 is improved. Furthermore, the adhesive strength between the semiconductor substrate 10 and the interlayer insulating film 80 is improved by the sacrificial oxide layer 65 remaining on the semiconductor substrate 10.

The improvement of the adhesive strength between the interlayer insulating film 80 and the edge region (B) reduces stress on the interlayer insulating film 80 in a subsequent CMP process. Therefore, the generation of particles of the insulating film, such as a circle defect, that can result during the CMP process when the interlayer insulating film 80 is under stress can be reduced or prevented.

If particles of the insulating film, such as a circle defect, fall down on contact holes, a defect, such as a void, may be generated when contact plugs are subsequently formed in the contact holes. However, if the adhesive strength between the interlayer insulating film 80 and the edge region 80 is improved, according to the techniques and practices discussed herein, the generation of particles of the insulating film is reduced or prevented. Thereby, the reliability of the semiconductor element is improved.

The second photoresist pattern 200 is patterned to have a first opening 210, a second opening 220, and a third opening 215. For example, the second photoresist pattern 200 may be first patterned to have the first opening 210 exposing the surface of a portion of the interlayer insulating film 80 corresponding to the gate electrode 40 and the second opening 220 exposing the surface of another portion of the interlayer insulating film 80 corresponding to the floating diffusion region 35.

Figure 6:
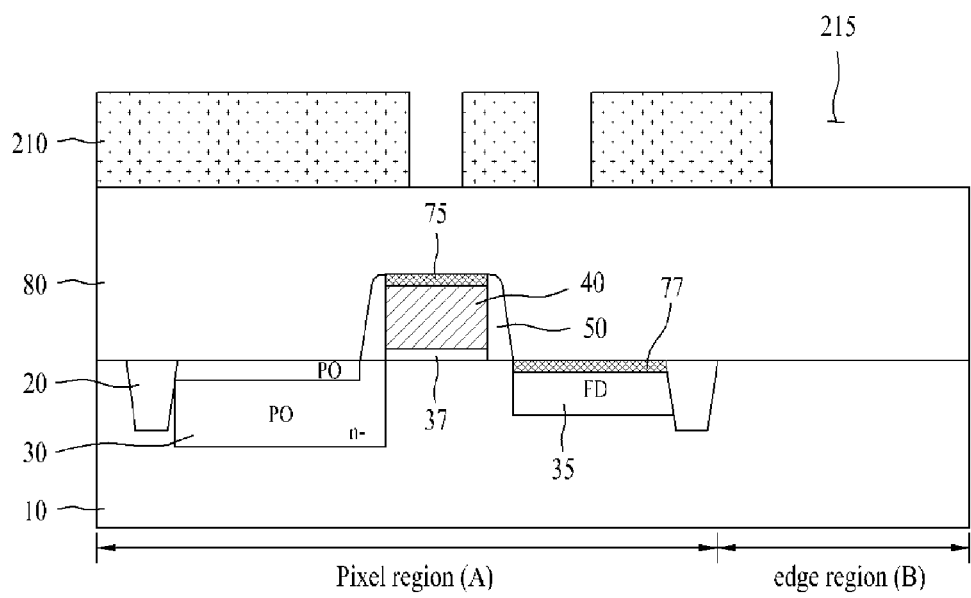

Thereafter, as shown in FIG. 6, the third opening 215 may be formed by selectively removing the second photoresist pattern 200. The third opening 215 of the second photoresist pattern 200 exposes the surface of another portion of the interlayer insulating film 80 corresponding to a portion of the edge region (B). The third opening 215 may have a diameter of about 1.0 to 2.0 mm. The third opening 215 may be formed by exposing a portion of the second photoresist pattern 200 corresponding to the edge of the edge region (B) and removing the exposed portion of the second photoresist pattern 200 using a solvent.

Figure 7:
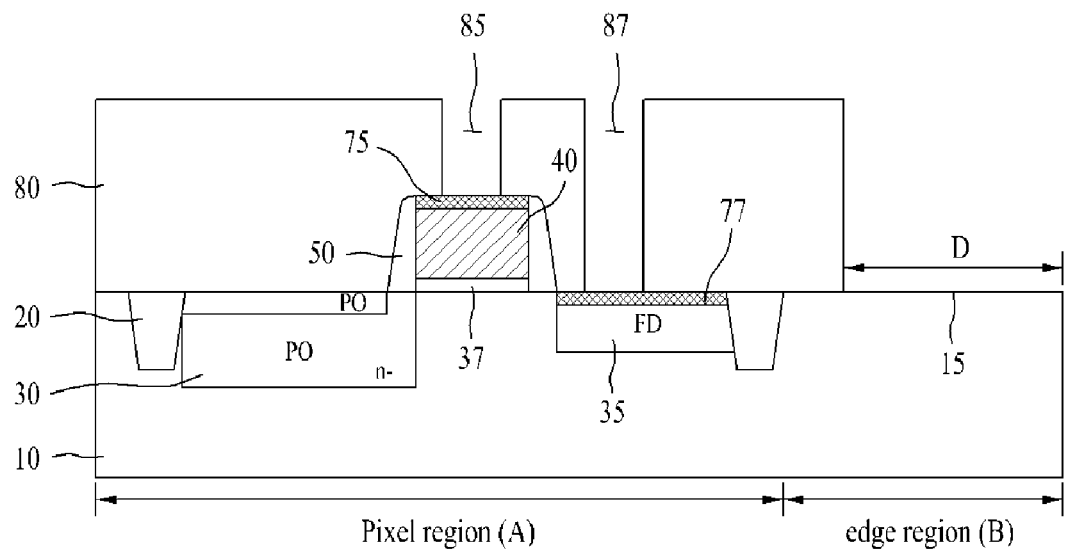

As shown in FIG. 7, contact holes 85 and 87, exposing the gate electrode 40 and the floating diffusion region 35, respectively, and an edge open part 15, exposing the edge of the edge region (B), may be formed by etching the interlayer insulating film 80 using the second photoresist pattern 200 with the first to third openings 210, 220, and 215 as an etching mask.

The salicide layers 75 and 77 formed on the gate electrode 40 and the floating diffusion region 35 may thus be exposed by the contact holes 85 and 87. Further, the edge open part 15 may be formed at the edge of the edge region (B) by removing the portion of the interlayer insulating film 80 corresponding to the edge region (B) using the second photoresist pattern 200.

The edge open part 15 on the edge region (B) may have a width (D) of about 1.0 to 2.0 mm or some other appropriate width such that laser marks formed on the edge region (B) can be confirmed.

As shown in FIG. 8, contact plugs 95 and 97 may be formed in the contact holes 85 and 87 of the interlayer insulating film 80. The contact plugs 95 and 97 may be formed by filling the contact holes 85 and 87 of the interlayer insulating film 80 with a metal and then performing a planarization process. The metal filling the contact holes 85 and 87 may be, for example, tungsten.

When the metal for forming the contact plugs 95 and 97 is deposited, the edge open part 15 of the edge region (B) is filled with the metal. The metal filling the edge open part 15 may be removed by a CMP process of the metal so as to expose laser marks for classifying the semiconductor element.

As apparent from the above description, an image sensor produced according to the techniques and practices described herein will have an increased adhesive strength, relative to conventional image sensors, between an edge region of a semiconductor substrate and an interlayer insulating film.

Further, stress applied on the interlayer insulating film, when a CMP process is performed on the interlayer insulating film, is minimized, thus reducing or preventing the generation of particles of the insulating film.

Moreover, a portion of the interlayer insulating film formed on the edge region may be removed by patterning a photoresist film for forming contact holes through the interlayer insulating film, thus allowing laser marks formed on the edge region to be confirmed.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating an image sensor comprising:
    forming a gate on a pixel region of a semiconductor substrate;
    forming a photo diode on the pixel region at a first side of the gate, and forming a floating diffusion region on the pixel region at a second side of the gate;
    forming an oxide film on the pixel region on which the gate, the photo diode, and the floating diffusion region are formed, and on an edge region of the semiconductor substrate;
    forming a first photoresist pattern having openings corresponding to the gate and the floating diffusion region on the oxide film, and forming a sacrificial oxide layer by etching the oxide film using the first photoresist pattern as a mask;

forming a metal layer on the first photoresist pattern, the gate, and the floating diffusion region;

forming a salicide layer on the gate and the floating diffusion region by performing rapid thermal processing;

etching a remaining non-salicided portion of the metal layer, the first photoresist pattern, and at least a portion of the sacrificial oxide layer;

forming an interlayer insulating film on the semiconductor substrate and planarizing the interlayer insulating film;

forming a second photoresist pattern having first, second, and third openings on the interlayer insulating film; and forming contact holes respectively corresponding to the gate and the floating diffusion region and forming an edge open part exposing a portion of the semiconductor substrate in the edge region by etching the interlayer insulating film on the edge region using the second photoresist pattern as an etching mask.

2. The method according to claim 1, wherein the edge open part of the edge region has a width of about 1.0 to 2.0 mm.

3. The method according to claim 1, wherein the formation of the gate includes:

forming a gate insulating film and a gate electrode by forming a gate oxide film and a polysilicon film on the pixel region and patterning the gate oxide film and the polysilicon film through a photolithography process and an etching process; and forming a gate spacer on side walls of the gate insulating film and the gate electrode by depositing an insulating film on the pixel region, on which the gate insulating film and the gate electrode are formed, and performing an etch-back process.

4. The method according to claim 1, wherein in the formation of the sacrificial oxide layer, the sacrificial oxide layer is formed on the photo diode and the edge region, exposing the gate and the floating diffusion region.

5. The method according to claim 1, wherein in the formation of the sacrificial oxide layer, the sacrificial oxide layer is formed using a thermal oxidation method.

6. The method according to the claim 1, wherein in the formation of the metal layer, the metal layer is formed by depositing at least one material selected from the group consisting of cobalt, nickel, and titanium.

7. The method according to claim 6, wherein in the formation of the metal layer, the metal layer is formed using a PVD method.

8. The method according to claim 1, wherein in the formation of the salicide layer, the salicide layer is formed by performing the rapid thermal processing at a temperature of about 300 to 1,000° C.

9. The method according to claim 3, wherein in the formation of the salicide layer, the gate electrode and the floating diffusion region react with the metal layer to become salicided, and the photo diode and the edge region are non-salicided by virtue of the sacrificial oxide layer and the first photoresist pattern formed thereon.

10. The method according to claim 1, wherein in the formation and planarization of the interlayer insulating film, at least a portion of the sacrificial oxide layer is not completely removed by etching, but partially remains.

11. The method according to claim 10, wherein in the formation and planarization of the interlayer insulating film, the interlayer insulating film includes at least one of borophospho silicate glass (BPSG) and undoped silicate glass (USG).

12. The method according to claim 9, wherein in the formation and planarization of the interlayer insulating film, the interlayer insulating film is formed on the non-salicided edge region, and is planarized.

13. The method according to claim 1, wherein in the formation of the edge open part, a portion of the edge region is exposed such that laser marks formed on the edge region are exposed.

* * * * *